Figure 1:
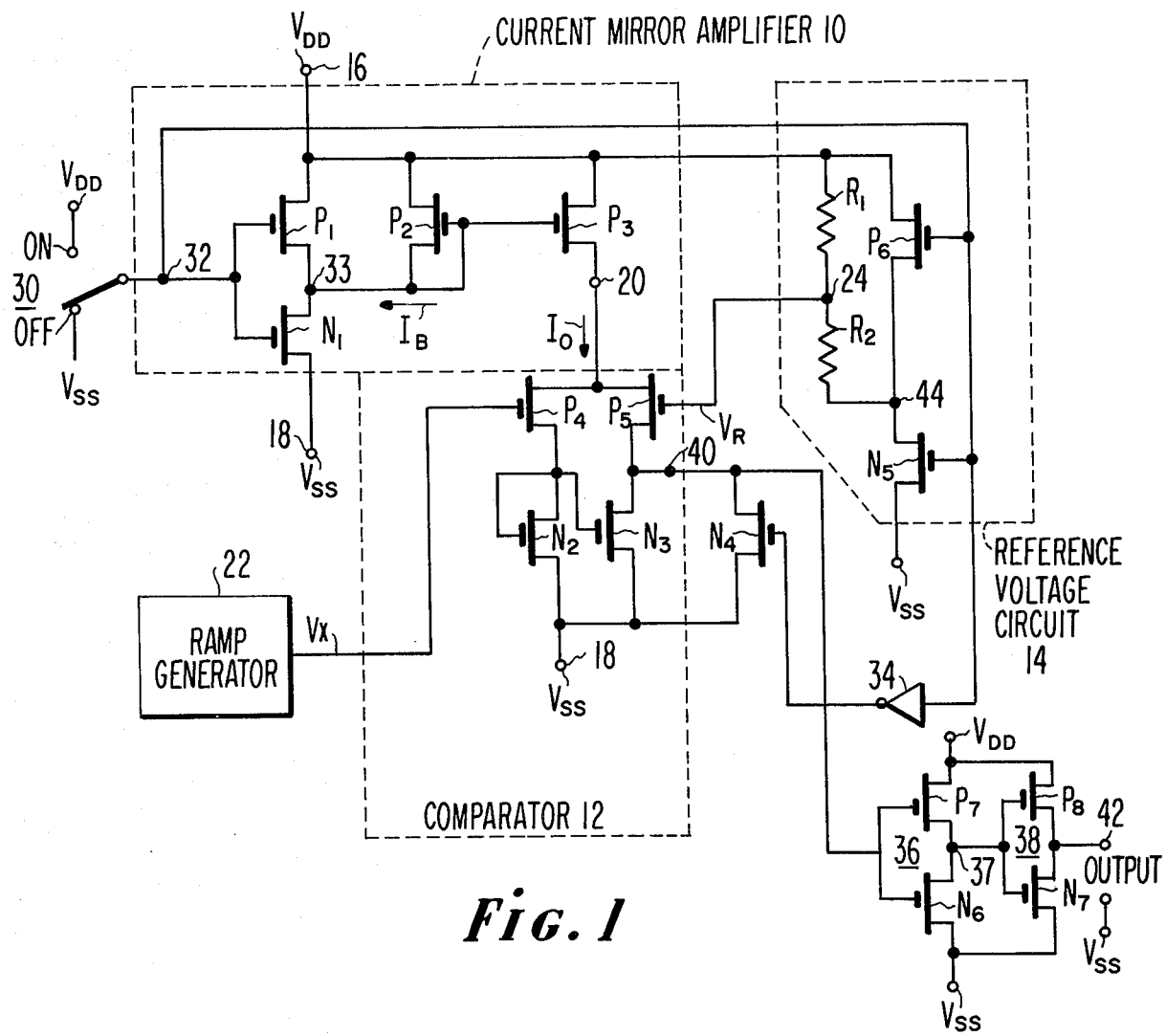

United States Patent [19]
Morgan et al.

[11] 3,943,380
[45] Mar. 9, 1976

[54] KEYED COMPARATOR

[75] Inventors: David Keith Morgan, Flemington; Robert Charles Heuner, Bound Brook, both of N.J.

[73] Assignee: RCA Corporation, New York, N.Y.

[22] Filed: July 26, 1974

[21] Appl. No.: 492,134

[52] U.S. Cl. .......... 307/235 T; 58/23 A; 58/23 BA; 307/297; 323/22 T; 330/22; 330/30 D; 330/35
[51] Int. Cl.²... H03K 5/20; H03F 3/45; H03F 3/16; G05F 3/02
[58] Field of Search ........ 307/235, 296, 297; 323/1, 323/4, 22 R, 22 T; 330/22, 30 D, 35; 58/23 A, 23 BA

[56] References Cited
UNITED STATES PATENTS

| | | | |
|---|---|---|---|
| 3,644,838 | 2/1972 | Graf | 330/35 X |
| 3,787,757 | 1/1974 | Sheng | 323/4 |
| 3,813,595 | 5/1974 | Sheng | 323/22 R X |
| 3,852,679 | 12/1974 | Schade | 330/35 X |
| 3,857,047 | 12/1974 | Knight | 330/30 D X |
| 3,863,169 | 1/1975 | Knight | 330/22 |

OTHER PUBLICATIONS

Hession et al., "Field–Effect Transistor Detector Amplifier Cell;" IBM Tech. Discl. Bull.; Vol. 13, No. 9, p. 2822; 2/1971.
Jacquart et al., "Operational Amplifier;" IBM Tech. Discl. Bull.; Vol. 14, No. 9, p. 2723; 2/1972.
Electronic Design, 2/15/1973, Vol. 21, No. 4, p. A9.

Primary Examiner—Stanley D. Miller, Jr.
Assistant Examiner—Larry N. Anagnos
Attorney, Agent, or Firm—H. Christoffersen; S. Cohen

[57] ABSTRACT

In the "on" condition of the circuit, a current mirror supplies a constant current to a comparator, a voltage divider circuit supplies a reference voltage to one input terminal of the comparator, and the input voltage to be compared to the reference voltage is applied to the other input terminal of the comparator. In the "off" condition of the circuit, the current mirror, the comparator and the voltage divider circuit are all cut off to reduce to substantially zero the power consumption of the circuit.

10 Claims, 2 Drawing Figures

U.S. Patent  March 9, 1976  3,943,380

KEYED COMPARATOR

The display of a light emitting diode wristwatch is normally off in order to reduce power consumption. When it is desired to observe the time, the watch wearer actuates a manual switch and alternating current power is applied to appropriate ones of the diodes to cause them to emit light. The power may be in the form of unipolarity pulses and the pulse duration is a measure of the amount of power being employed.

It is desirable in the operation of a wristwatch such as described above that during the time the display is off, the circuits for operating the display employ minimal standby power. The reason is to extend, as long as possible, the life of the small battery providing the power. It is also desirable, for the same reason, that the amount of power employed to operate the display, that is, the duration of the unipolarity pulses, be the minimum necessary to create a pleasing and legible display. However, the amount of power needed to accomplish the latter will depend upon the ambient lighting conditions. A display which looks pleasing at a low level of ambient light, for example that present within a reasonably well lighted room, may look "washed out" in daylight. In order to deal with this problem, circuits have been developed which sense the amount of ambient light and adjust the pulse duration in accordance therewith so that less power is applied to the display when the ambient light intensity is relatively low and more power is applied to the display when the light intensity is relatively high.

The circuit of the present application represents an improved solution to the problem discussed above and is also useful in many other applications, especially where relatively low power dissipation is desired.

Figure 2:
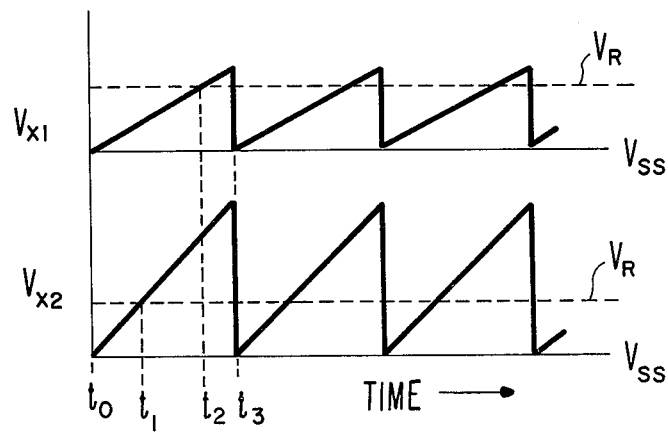

The invention is illustrated in the drawing in which:

FIG. 1 is a block and schematic circuit diagram of a preferred embodiment of the invention; and FIG. 2 is a drawing of waveforms produced by the ramp generator of FIG. 1.

The circuit of FIG. 1 includes a current mirror amplifier 10, a comparator 12 and a reference voltage circuit 14.

The current mirror amplifier includes a complementary-symmetry, metal-oxide-semiconductor (COS/MOS) inverter $P_1N_1$. The conduction paths of these transistors are connected in series between the supply terminals 16 and 18 for voltages $V_{DD}$ and $V_{SS}$. Terminal 16 may also be considered the "common" terminal of the current mirror and terminal 32 a control terminal. Voltage $V_{DD}$ may be a level such as +2.5 volts and $V_{SS}$ may be at a reference level, such as ground.

Transistor $P_2$ connected gate-to-drain electrode, serves as the reference signal establishing means for the current mirror. Its conduction path is connected across the conduction path of transistor $P_1$. Transistor $P_3$ is connected at its gate electrode to the drain-gate connection of transistor $P_2$ and at its source electrode to the $V_{DD}$ terminal 16. Terminal 20 at the drain electrode of transistor $P_3$ serves as the output terminal of the current mirror and current $I_0$ flows from this output terminal when the current mirror is turned on.

The comparator 12 includes the differential pair of P-type transistors $P_4$ and $P_5$ which are connected at their source electrodes to the output terminal 20 of the current mirror 10. The comparator includes also N type transistor $N_2$ which is connected gate electrode-to-drain electrode and which forms a current mirror with transistor $N_3$. The drain-gate connection of transistor $N_2$ is connected to the drain electrode of transistor $P_4$ and to the gate electrode of transistor $N_3$. The source electrodes of transistors $N_2$ and $N_3$ are connected to the $V_{SS}$ terminal 18. The drain electrode of transistor $N_3$ is connected to the drain electrode of transistor $P_5$ at comparator output terminal 40. Ramp generator 22 supplies its output to the gate electrode of transistor $P_4$. While the wave produced by generator 22 is shown as a linear ramp, it may instead be non-linear and in one design was an exponential ramp.

The reference voltage establishing circuit 14 comprises a voltage divider $R_1$, $R_2$ in series with the conduction path of N type transistor $N_5$. The conduction path of P type transistor $P_6$ is connected across the voltage divider resistors $R_1$, $R_2$. The tap 24 between resistors $R_1$ and $R_2$ connects to the gate electrode of transistor $P_5$.

The operation of the circuit of FIG. 1 will be given in the context of its use for supplying power to the display of light emitting diodes (not shown). However, it is to be understood that the keyed comparator illustrated has much wider use than this.

The switch 30 may be considered to correspond to the manually actuated switch on the wristwatch (although, in practice, there may be a circuit between the switch and the circuit input terminal 32). The ramp generator 22 may be considered to include in its RC time constant circuit, a light sensitive resistance element, that is, one whose resistance varies as a function of the ambient light it receives. As the light intensity increases, the resistance exhibited by this resistor decreases. As a result, the slope of the sawtooth wave produced by the ramp generator varies as a function of the light intensity, decreasing with decreasing light intensity.

FIG. 2 illustrates the sawtooth wave (in somewhat idealized form) under two different light conditions. As already mentioned, in practice this wave may be of exponential rather than linear form; however, the operating principles remain the same. The upper wave $V_{x1}$ is the sawtooth produced at a relatively low level of light and the lower wave $V_{x2}$ is the sawtooth produced at a relatively high level of light. Note that at the relatively low light level, the ramp exceeds the reference voltage level $V_R$ for a relatively short interval $t_2$–$t_3$ each period of the ramp voltage, and that at the relatively high light level, the ramp exceeds the reference voltage level $V_R$ for a relatively longer time $t_1$–$t_3$ each period of the ramp voltage.

When the switch 30 is off, $V_{SS}$ is applied to the gate electrodes of transistors $P_1$ and $N_1$. This turns transistor $N_1$ off and accordingly the current mirror amplifier 10 is turned off. In other words, no current $I_B$ flows and no current $I_0$ flows. Transistor $P_1$ is on and serves as a discharge path for any charge which may be present at node 33 and places this node at $V_{DD}$.

The voltage $V_{SS}$ is also applied to the gate electrodes of transistors $N_5$ and $P_6$. This turns off transistor $N_5$. Accordingly, no current flows through the resistors $R_1$ and $R_2$ and no power is dissipated in the reference voltage circuit.

As no current $I_0$ flows, no power is dissipated in the comparator 12.

The COS/MOS inverter 34 (which is similar in structure to inverters 36 and 38) translates the $V_{SS}$ level to a $V_{DD}$ level which it applies to the gate electrode of transistor $N_4$. This causes this transistor to conduct and to apply an input $V_{SS}$ to inverter 36. This both discharges the capacitance at the input node of the inverter and prevents the node from "floating" which, if not prevented, could lead to undesired power dissipation. While inverter 34 has its P type transistor on, the output terminal of this transistor connects to the gate electrode of transistor $N_4$ so that inverter 34 dissipates essentially no power. In similar fashion, as the transistors $N_6$ and $P_8$ of inverters 36 and 38 are off, these inverters dissipate essentially no power.

Summarizing the above, when the switch 30 is off, that is, when the keyed comparator system is keyed off, essentially no power is dissipated in the circuit of FIG. 1. The current mirror amplifier 10 draws no current; the voltage reference circuit 14 is disabled and draws no current; the comparator 12 is disabled and draws no current; the inverters 34, 36 and 38 draw essentially no power.

When the switch 30 is turned on, $V_{DD}$ is applied to the COS/MOS inverter $P_1$, $N_1$. This turns transistor $N_1$ on and transistor $P_1$ off. The reference current establishing transistor $P_2$ now turns on and the input current $I_B$ flows through transistors $P_2$ and $N_1$. The size of the MOS transistor $N_1$, that is, its width and length, are chosen to minimize the current $I_B$ to the desired value such as 10 microamperes ($\mu A$). The input current flow is:

$$I_B \cong \frac{(V_{DD}-V_{TP})}{Z_{N1}}$$

where $V_{TP}$ is the threshold voltage of transistor $P_2$, and $Z_{N1}$ is the impedance of the conduction channel of transistor $N_1$ ($V_{SS}$ being assumed to be zero).

The input current $I_B$ flowing in the current mirror will cause a proportional output current $I_0$ to flow through the conduction path of transistor $P_3$. The proportion of these currents will depend on the respective geometries of the devices $P_2$ and $P_3$. If, for example, transistors $P_2$ and $P_3$ are substantially identical, then $I_0 = I_B$, independently of the drain to source voltage of transistor $P_3$ as long as transistor $P_3$ is in saturation $(V_{GS}-V_{TH}) \leq V_{DS}$.

The output current $I_0$ of the current mirror flows to the comparator 12. The reference voltage $V_R$ applied to the comparator is that present at circuit point 24.

Referring now to the reference voltage circuit 14, when the switch 30 is placed in the "on" position, $V_{DD}$ is applied to the COS/MOS inverter $N_5$, $P_6$. This turns on N type transistor $N_5$ and turns off P type transistor $P_6$. Current now flows through the voltage divider comprising resistors $R_1$ and $R_2$ and the conduction path of transistor $N_5$. The resistors $R_1$ and $R_2$ are of relatively high value ($R_1 + R_2$ may be in the 100 kilohm range) and the impedance of the conduction channel of transistor $N_5$, when this transistor is on, is much much lower than $R_2$. The high total resistance $R_1 + R_2$ reduces to a minimum the power dissipated in the reference voltage circuit 14 relative to the power required to operate the display (not shown).

The reason that it is possible in the present circuit to employ a high value of $R_1 + R_2$ is that the comparator 12 is formed of MOS transistors. Thus, as contrasted to the case of employing a bipolar transistor comparator for circuit 12, there is essentially no current flow from the node 24 into the gate electrode of transistor $P_5$ in view of the extremely high impedance exhibited by the gate circuit of transistor $P_5$. So, there is no shunt path across resistor $R_2$ and the latter can be chosen to be of very high value and $R_1$ therefore can be chosen also to be of high value in the desired proportion to $R_2$.

Were the comparator 12 a bipolar transistor circuit, there would be a relatively low impedance base current path connected to node 24. The amount of base current drawn would vary as a function of the beta of the transistor which can vary widely. This variation in beta would lead to a corresponding variation in the value of the reference voltage at 24 and, of course, this would be highly undesirable. The present circuit, on the other hand, operates as a substantially ideal voltage divider in view of the extremely high impedance of the gate circuit of transistor $P_5$.

Another feature of the circuit 14 is its insensitivity to process variations. At the present state of the integrated circuit art, it is difficult to reproduce, to great accuracy, a transistor such as $N_5$, from chip-to-chip. However, as the channel resistance of transistor $N_5$ is made relatively low compared to $R_2$, its (the transistors resistance) value has substantially no effect on the voltage $V_R$ produced at node 24. On the other hand, the ratio between $R_1$ and $R_2$ can be reproduced, chip-to-chip, with great accuracy, even using processes where $R_1$ individually or $R_2$ individually can vary. This is a characteristic of integrated circuit manufacture. Thus so called "P well" resistors, or ion implanted resistors or even pinch resistors may be used for $R_1$ and $R_2$.

The ramp generator 22 supplies the second input to the comparator, this one to the gate electrode of transistor $P_4$. When the voltage $V_X$ is lower than the voltage reference $V_R$ applied to the gate electrode of transistor $P_5$, transistor $P_4$ conducts and transistor $N_2$ conducts. Transistor $N_3$ turns on as its gate electrode is more positive than its source electrode by the voltage drop across the conduction path of transistor $N_2$. This places the output terminal 40 of the comparator a relatively low voltage level close to $V_{SS}$ and the inverter 36 drives the inverter 38. The latter drives the voltage level at the terminal 42 to $V_{SS}$.

It may appear that when transistor $N_3$ goes on, transistor $P_5$ also should turn on and pass a portion of the current $I_0$. However, in practice, as long as the voltage $V_X$ is less than the voltage $V_R$, and the current $I_0$ is chosen to be a suitable value, the voltages present at terminals 20 and 24 (the source to gate voltage of transistor $P_5$) will be lower than the threshold voltage $V_{TP}$ of transistor $P_5$. Therefore, transistor $P_5$ will remain off and transistor $P_4$ will remain on and the voltage at terminal 40 will remain close to $V_{SS}$. Inverter 36 drives inverter 38 and the output voltage is at $V_{SS}$.

When the voltage $V_X$ becomes equal to $V_R$, the difference between the voltages present at terminals 20 and 24 becomes slightly greater than $V_{TP}$ and equal to the voltage difference between the gate electrode of transistor $P_4$ and terminal 20. Hence, the current $I_0$ splits equally through the conduction paths of transistors $P_4$ and $P_5$. The voltage at terminal 40 is proportional to the ratio of the impedances of transistors $P_5$ to $N_3$. The input circuit to inverter 36 and conduction path of device $N_4$, which is off, represent very high impedances and therefore do not affect this voltage. Since transistor $P_5$ rapidly becomes a relatively low impedance compared to transistor $N_3$, due to the increasing input voltage $V_X$, the voltage at node 40 will rapidly approach the voltage at node 20, where the voltage at node 20 is given by $$V_{20} \approx V_R + V_{TP} + \frac{\sqrt{I_0}}{K\frac{W}{L}},$$

where
K is a constant,
W is the width of the conduction channel of transistor P$_5$; and
L is the length of this conduction channel.

Since it is desirable to have a full digital swing at the output of the comparator when $V_X = V_R$ and the voltage swing at node 40 is not a full digital signal (is not of amplitude $V_{SS}$ or $V_{DD}$), inverters 36 and 38 are employed to convert the low level voltage swing of node 40 to a full digital swing at the output. To accomplish this the conduction channel of device N$_6$ is made of larger cross section than that of device P$_7$, that is, to make transistor N$_6$ of lower impedance, when it conducts, than the impedance of transistor P$_7$, when it conducts. With this design, inverter 36 drives inverter 38 which drives the output of $V_{DD}$.

When the voltage $V_X$ exceeds $V_R$, the voltage at node 20 follows $V_X$ directly as $$V_{20} \approx V_{40} \approx V_{TP} + \frac{\sqrt{I_0}}{K\frac{W_P}{L_P}} + V_X$$

Since transistors P$_4$ and P$_5$ will be of relatively lower impedance than transistors N$_2$ and N$_3$ because of the relative magnitudes of their gate to source potentials, the current split of I$_0$ will be dependent only on the relative magnitudes of the impedances of transistors N$_2$ and N$_3$. Since transistors N$_2$ and N$_3$ are identical in device size, and their gate to source potentials are equal, the current split of I$_0$ is close to half. As the voltage at node 20 approaches $V_{DD}$, the difference between the voltage at node 20 and $V_X$ (the voltage at the gate electrode of transistor P$_4$) becomes less than $V_{TP}$ and this causes transistor P$_4$ to cut off. This terminates the current flow through transistor P$_4$ so that transistor N$_2$ cuts off. This causes transistor N$_3$ to turn off. Transistor P$_5$ will remain conducting, thus maintaining node 40 at a potential equal to $V_{DD}$. However, since transistor N$_3$ is turned off, the current I$_0$ approaches zero because the only load remaining at node 40 is a capacitive load.

In the operation of the comparator 12, it is found that a relatively small amount of current fully charges the capacitance at node 40 very quickly and causes the output very quickly to switch from $V_{SS}$ to $V_{DD}$. Accordingly, it has been found that even with relatively low gain MOS transistors in the comparator, the circuit has very good resolution—it will switch at the voltage $V_R \pm$ 0.05 volts, where $V_R$ is the voltage at node 24. At the frequency involved, that is, a frequency of roughly 500 Hz for wave $V_X$, this was found to be quite adequate in the practical example discussed here by way of example.

The operation described above continues for so long as the switch 30 is in the "on" position. The amount of time during each ramp period that the output is at $V_{DD}$ will depend upon the slope of the ramp. At relatively low ambient light levels, where the ramp may have the form $V_{X1}$ in FIG. 2, each output pulse will have a relatively short duration $t_2-t_3$ and the power consumption will be relatively low. This relatively short pulse will cause the light emitting diodes to emit light at a relatively low level. When the ambient light is relatively high, the ramp generator will produce a sawtooth wave such as $V_{X2}$ shown in FIG. 2. Now the output will be at $V_{DD}$ for the interval $t_1-t_3$ of each ramp period and the power will be relatively higher. The light emitting diodes, in this case, will emit light at a substantially higher light intensity.

When the switch 30 is returned to the "off" position, transistor N$_1$ is turned off, turning off the current mirror amplifier 10. Transistor N$_5$ is turned off turning off the reference voltage circuit 14. Transistor P$_6$ is turned on to discharge any capacitance which may be present at node 44, that is, at the drain of transistor N$_5$. This also places node 24 at $V_{DD}$ to place the gate electrode of P$_5$ at $V_{DD}$. Also, inverter 34 applies the $V_{DD}$ level to the gate electrode of transister N$_4$, as already mentioned, to cause transistor N$_4$ to conduct and to place the $V_{SS}$ level at the common gate connection of inverter 36.

The circuit described above is easily reproducible in integrated circuit form and its characteristics remain the same chip-to-chip. Substantially no power is dissipated in the off condition of the circuit. When the circuit is turned on, the reference voltage circuit 14 dissipates very little power compared to the light emitting diode display and the circuit has an abrupt and reproducible voltage transistion point.

While the circuit has been described in terms of its use in a wristwatch employing a light emitting diode display, it is to be understood that it is not limited to this use. Moreover, while the input wave as shown to be a ramp having a slope proportional to ambient light, in other applications other waves of other shapes could be employed instead. For example, in one common application, namely, threshold detection, wave $V_X$ is simply an analog voltage and the circuit produces an output which indicates whether or not $V_X$ is greater than the threshold level $V_R$. Regardless of the shape of the input wave, the circuit will have a reproducible transfer characteristic, that is, the output at terminals 42 will switch from $V_{SS}$ to $V_{DD}$ and vice versa at the reference voltage established by the voltage divider R$_1$, R$_2$ to within narrow limits.

In one particular design of the circuit, R$_1$ was chosen to have a value of 75 kilohms and R$_2$ a value of 25 kilohms. The conduction channel resistance of transistor N$_5$ is relatively low compared to these values and is ignored in the calculation below. The reference voltage level is:

$$V_R = R_2 \frac{(V_{DD}-V_{SS})}{R_1+R_2} = \frac{V_{DD}}{4}$$

for the case where $V_{SS}$ is zero volts.

What is claimed is:
1. In combination:
two terminals across which an operating voltage may be applied;
reference voltage establishing means comprising a voltage divider and a switch connected in series between said terminals;
a current amplifier comprising input current path means, including a switch in series in said path means, said path means connected between one of said terminals serving as the input terminal of said amplifier and the other of said terminals serving as the common terminal of said amplifier, and output current path means connected between said common terminal and the output terminal of said current amplifier, said switch, when open, serving to terminate the flow of current between said input terminal and said common terminal of said amplifier and thereby to terminate also the flow of current between said common terminal and said output terminal of said amplifier;

a comparator comprising a differential amplifier having a common terminal, an output terminal, and two signal input terminals, said common terminal of said comparator connected to said output terminal of said current amplifier, one of said input terminals connected to a point along said voltage divider and the second input terminal for receiving a voltage which may vary to values greater and less than that at said point along said voltage divider; and means coupled to said switch of said reference voltage establishing means and to said switch of said current amplifier for concurrently closing and opening these switches.

2. In the combination as set forth in claim 1, said voltage divider comprising a resistive voltage divider and said switch of said reference voltage establishing means comprising a metal oxide semiconductor first control transistor having a conduction path and a control electrode for controlling the conductivity of said path, said conduction path being in series with said voltage divider, and said conduction path having a resistance, when it conducts, which is much smaller than that of said voltage divider.

3. In the combination as set forth in claim 2, further including a metal oxide semiconductor second control transistor of opposite channel conductivity type than said first control transistor, said second control transistor having a conduction path connected across said voltage divider and a control electrode connected to the control electrode of said first control transistor.

4. In the combination as set forth in claim 1, said current amplifier comprising first and second metal oxide semiconductor transistors of opposite channel conductivity types and a reference current establishing means, the conduction path of said first transistor serving as said output current path means, and said input current path means comprising the conduction path of said second transistor, serving as said switch, in series with said reference current establishing means, the latter being connected between the control electrode of said first transistor and said common terminal of said current amplifier for controlling the potential of said control electrode.

5. In the combination as set forth in claim 1, said switch in said reference voltage establishing means being ganged to said switch of said current amplifier.

6. A keyed bias circuit comprising, in combination:
two terminals between which an operating voltage may be applied;
two metal oxide semiconductor transistors of opposite channel conductivity types, each having a gate electrode and a conduction path, said conduction paths connected in series between said two terminals and said gate electrodes connected to a control terminal;
means for applying voltage levels to said control terminal for switching said transistors between conducting and non-conducting states;
a voltage divider connected across the conduction path of one of said transistors and having an output voltage tap, said divider having a resistance which is much higher than that of the conduction path of the other of said transistors;
and a circuit connected to said tap having an input resistance which is much much higher than the resistance of said voltage divider.

7. A circuit as set forth in claim 6 wherein said circuit connected to said tap comprises the unbypassed gate electrode of an MOS transistor.

8. A comparator system comprising, in combination:
a first current mirror having a common, an input, and an output terminal;
a pair of transistors, each having an input, an output and a control electrode, said input electrodes connected to a common terminal, one output electrode connected to the input terminal of the current mirror, the other output electrode connected to the output terminal of the current mirror, and said control electrodes serving as the signal input terminals of said comparator;
a second current mirror having a common, an input and an output electrode, said output electrode connected to the common terminal to which said input electrodes are connected;
first and second operating voltage terminals, the first connected to the common terminal of the first current mirror and the second connected to the common terminal of the second current mirror;
means for coupling the input terminal of said second current mirror to said first operating voltage terminal and
wherein said second current mirror comprises a first field-effect transistor of one channel conductivity type having a conduction path through which the input current of said second current mirror flows, connected between the input and common terminals of said current mirror, a second field-effect transistor of the same channel conductivity type having a conduction path in parallel with that of said first field-effect transistor, wherein said means for coupling comprises a third field-effect transistor of opposite channel conductivity type to said first and second transistors having a conduction path in series between said input terminal and said first operating voltage terminal, and having a control electrode connected to the control electrode of said second transistor, and a fourth field-effect transistors of the same channel conductivity type as said first transistor having a conduction path connected between the common and output terminals of said second current mirror and having a control electrode connected, in common, to the control electrode of said first transistor and the input terminal of said second current mirror.

9. In combination:
first and second field-effect transistors of opposite channel conductivity types, each having a conduction path and a control electrode, said conduction paths connected in series between two operating voltage terminals and said control electrodes connected to a control terminal;
a resistive voltage divider connected across the conduction path of the first of said transistors;

means coupled to said control terminal for applying voltage levels thereto for switching said first transistor on and said second transistor off and vice versa;

a field-effect transistor comparator circuit having two input terminals, one at the control electrode of a third field effect transistor and the other at the control electrode of a fourth field-effect transistor;

a tap on said voltage divider connected to one of said input terminals; and means for applying a voltage to be compared with that at said tap to said other input terminal.

10. In the combination as set forth in claim 9, wherein said transistors in said comparator circuit each has a conduction path and wherein said comparator circuit includes a current source and two current paths one such path through one of its transistors and the other through the other of its transistors, the relative values of the signals at said two input terminals controlling the relative current flow in said two current paths, and further including:

means for concurrently interrupting the flow of current from said current source and for applying a signal to said control terminal of a sense to switch said first transistor on and said second transistor off.

* * * * *